(12) United States Patent
Chikugawa

(10) Patent No.: US 7,161,190 B2
(45) Date of Patent: Jan. 9, 2007

(54) SEMICONDUCTOR LIGHT-EMITTING DEVICE AND METHOD OF MANUFACTURING THE SAME

(75) Inventor: Hiroshi Chikugawa, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/193,364

(22) Filed: Aug. 1, 2005

(65) Prior Publication Data

US 2006/0022216 A1    Feb. 2, 2006

(30) Foreign Application Priority Data

Aug. 2, 2004    (JP)    ............... 2004-225951

(51) Int. Cl.
*H01L 31/024*    (2006.01)
(52) U.S. Cl. .................. 257/99; 257/79; 257/88; 257/98; 257/E33.058; 257/E33.056; 257/E33.066
(58) Field of Classification Search .............. 257/79, 257/99
See application file for complete search history.

(56) References Cited

U.S. PATENT DOCUMENTS

| | | | |
|---|---|---|---|
| 5,367,196 A | | 11/1994 | Mahulikar et al. |
| 5,907,151 A | * | 5/1999 | Gramann et al. ......... 250/214.1 |
| 6,188,130 B1 | | 2/2001 | Ramirez et al. |
| 6,335,548 B1 | | 1/2002 | Roberts et al. |
| 6,561,680 B1 | * | 5/2003 | Shih ........................... 362/294 |
| 6,645,783 B1 | * | 11/2003 | Brunner et al. ............... 438/26 |
| 6,936,855 B1 | * | 8/2005 | Harrah ......................... 257/88 |
| 7,012,277 B1 | * | 3/2006 | Takenaka ...................... 257/79 |
| 2002/0163001 A1 | * | 11/2002 | Shaddock ..................... 257/79 |
| 2003/0058650 A1 | * | 3/2003 | Shih .......................... 362/294 |
| 2003/0142500 A1 | * | 7/2003 | Bachi et al. ................. 362/373 |
| 2003/0183907 A1 | * | 10/2003 | Hayashi et al. ............. 257/666 |
| 2004/0012958 A1 | * | 1/2004 | Hashimoto et al. ......... 362/241 |
| 2004/0099874 A1 | * | 5/2004 | Chang et al. ................. 257/98 |
| 2004/0135156 A1 | * | 7/2004 | Takenaka ...................... 257/79 |
| 2005/0258438 A1 | * | 11/2005 | Arik et al. .................... 257/88 |

FOREIGN PATENT DOCUMENTS

| | | |
|---|---|---|
| JP | 11-46018 A | 2/1999 |
| JP | 2000-49384 A | 2/2000 |
| JP | 2000-58924 A | 2/2000 |
| JP | 2000-77725 A | 3/2000 |
| JP | 2000-124566 A | 4/2000 |
| JP | 2000-216443 A | 8/2000 |
| JP | 2002-222998 A | 8/2002 |
| JP | 2003-78219 A | 3/2003 |
| JP | 2004-128424 A | 4/2004 |
| JP | 2004-214436 A | 7/2004 |

* cited by examiner

*Primary Examiner*—Minhloan Tran
*Assistant Examiner*—Eduardo A. Rodela
(74) *Attorney, Agent, or Firm*—Birch, Stewart, Kolasch & Birch, LLP

(57) ABSTRACT

A semiconductor light-emitting device includes a light-emitting element, a first lead frame having a main surface having the light-emitting element mounted thereon, a second lead frame spaced apart from the first lead frame, resin molded portions for fixing the first and second lead frames, and a heat-radiating member bonded to a back face of the first lead frame with a brazing member (electrically-conductive layer) containing metal interposed therebetween. The brazing member and the heat-radiating member are formed immediately below and around the light-emitting element.

10 Claims, 6 Drawing Sheets

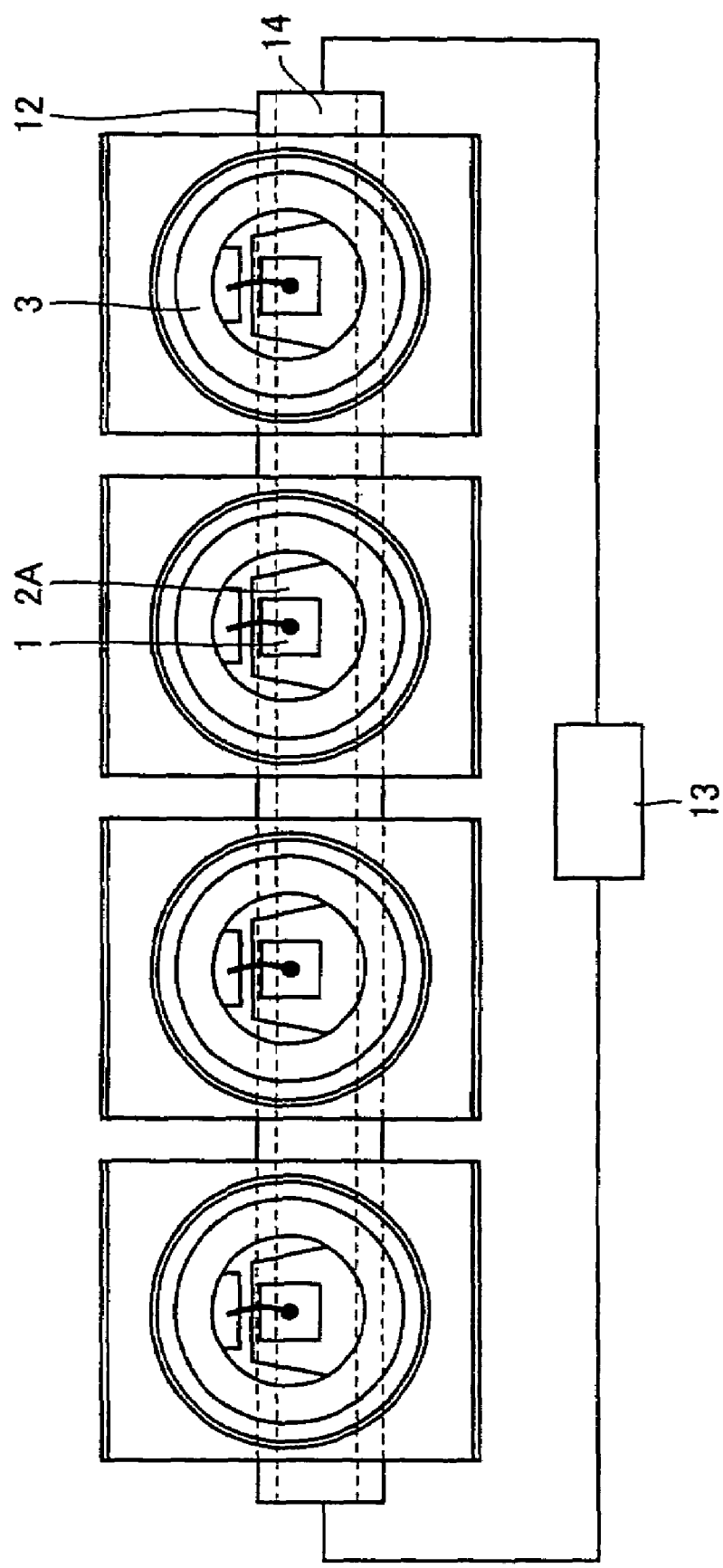

SEMICONDUCTOR LIGHT-EMITTING DEVICE AND METHOD OF MANUFACTURING THE SAME

This nonprovisional application is based on Japanese Patent Application No. 2004-225951 filed with the Japan Patent Office on Aug. 2, 2004, the entire contents of which are hereby incorporated by reference.

BACKGROUND OF THE INVENTION

1. Field of the Invention

The present invention relates to a semiconductor light-emitting device and a method of manufacturing the same, and more particularly, to a semiconductor light-emitting device used for backlight of a liquid crystal, a lighting device, an image scanner and the like that require a high heat dissipation property, and a method of manufacturing the same.

2. Description of the Background Art

In a light-emitting diode, a semiconductor laser or the like, an increase in optical output causes a temperature rise in a device, resulting in, for example, a decrease in optical output. To prevent this, a package having a high heat dissipation property is required.

FIG. 6 is a top view showing a lead frame on which a plurality of packages, each of which is a conventional semiconductor light-emitting device, are arranged. FIG. 7A is an enlarged view of one of the packages shown in FIG. 6. FIG. 7B is a cross-section showing a semiconductor light-emitting device composed of one of the packages shown in FIG. 7A.

Referring to FIGS. 6, 7A and 7B, a light-emitting element 101 such as a light emitting diode (LED) is mounted on a lead frame 2. On a main surface of lead frame 102, a resin molded portion 103 (on an upper side) is provided to surround light-emitting element 101. Lead frame 102 has a lead terminal portion 104. Lead frame 102 is formed to correspond to a circuit pattern, and light-emitting element 101 and lead frame 102 are connected as appropriate by a wire 105. Resin molded portion 103 has a reflecting portion 106. Accordingly, light emitted from light-emitting element 101 is reflected thereon so that an angle at which the light is to be emitted is adjusted. A resin molded portion 107 (on a lower side) is formed on a back face of lead frame 102. Lead frame 102 is fixed by resin molded portions 103 and 107.

For a semiconductor laser element, it is common to adopt a structure in which a submount is provided under the light-emitting element to release heat generated therefrom into a metal package via the submount to improve its heat dissipation property. Such a structure is disclosed in, for example, Japanese Patent Laying-Open No. 2004-128424 (Patent Document 1).

Japanese Patent Laying-Open No. 2003-078219 (Patent Document 2) discloses a printed wiring board having a copper foil layer serving as wiring and a concave portion on a main surface. The concave portion has a plate-like shape, and has a heat-radiating portion formed at the bottom.

Japanese Patent Laying-Open No. 2000-124566 (Patent Document 3) discloses a metallized substrate in which a main surface of a ceramic substrate having a high thermal conductivity is metallized.

DISCLOSURE OF THE INVENTION

However, the above-described semiconductor light-emitting devices have problems below.

For example, a white LED used for backlight of a liquid crystal or lighting requires extremely high luminous intensity. It is difficult for such a light-emitting element to attain the required luminous intensity only by improving the conversion efficiency from electricity to light. Therefore, an attempt is made to increase the size of the light-emitting element itself As a result, heat generation from the light-emitting element tends to increase.

In a technique of manufacturing a package with metal as in Patent Document 1, however, a metal portion assumes a complex shape. Therefore, high precision machining is required, which makes it impractical to realize mass-production with the use of, for example, a mold.

If a light-emitting element is mounted on a copper foil or a metallized layer as in Patent Documents 2 and 3, thermal diffusivity in a horizontal direction is disadvantageously small due to a small thickness of the copper foil or the metallized layer.

SUMMARY OF THE INVENTION

An object of the present invention is to provide a semiconductor light-emitting device excellent in heat dissipation property and a method of manufacturing the same.

A semiconductor light-emitting device according to the present invention includes a light-emitting element, a first lead frame having a main surface having the light-emitting element mounted thereon, a resin portion for fixing the first lead frame, and a heat-radiating member bonded to a back face of the first lead frame with an electrically-conductive layer containing metal interposed therebetween.

Accordingly, heat generated in the light-emitting element is more likely to be transferred to the heat-radiating member via the first lead frame. As a result, a semiconductor light-emitting device excellent in heat dissipation property is provided.

The electrically-conductive layer and the heat-radiating member are preferably formed immediately below and around the light-emitting element.

Accordingly, it is possible to further improve efficiency in heat dissipation.

The heat-radiating member preferably has a cavity portion serving as a coolant channel.

By urging a coolant to flow through the cavity portion, it is possible to further improve efficiency in heat dissipation.

The heat-radiating member may be provided to couple a plurality of the first lead frames each having the light-emitting element mounted thereon.

Accordingly, the heat-radiating member can be used as a member for coupling a plurality of lead frames.

The heat-radiating member may contain at least one material selected from the group consisting of copper, aluminum, a copper alloy, and an aluminum alloy. The heat-radiating member may be formed of a ceramic material.

With the use of any material descried above, the heat-radiating member sufficiently functions as a member for improving efficiency in heat dissipation.

The semiconductor light-emitting device further includes, in one aspect, a second lead frame spaced apart from the first lead frame and electrically connected to the light-emitting element via a wire. The heat-radiating member made of a ceramic material may be bonded to the back face of the first lead frame and a back face of the second lead frame with the electrically-conductive layer interposed therebetween. In this case, the electrically-conductive layer is split in order to make the first lead frame and the second lead frame electrically non-conductive via the electrically-conductive layer in a gap between the first and second lead frames.

Accordingly, with the simple technique, it is possible to improve efficiency in heat dissipation of the semiconductor light-emitting device in which each of a plurality of lead frames has a light-emitting element mounted thereon.

The first lead frame may have a plurality of the light-emitting elements mounted thereon, and the heat-radiating member may be provided in a lower portion of each of the plurality of light-emitting elements.

Accordingly, it is possible to improve efficiency in heat dissipation of the semiconductor light-emitting device in which a lead frame has a plurality of light-emitting elements mounted thereon.

A method of manufacturing a semiconductor light-emitting device according to the present invention includes the steps of forming a resin portion for holding a lead frame such that a back face of the lead frame is exposed, mounting a light-emitting element on a main surface of the lead frame located at the exposed back face of the lead frame, and bonding a heat-radiating member to the exposed back face of the lead frame with an electrically-conductive layer containing metal interposed therebetween.

With the steps above, a semiconductor light-emitting device having a high heat dissipation property is provided.

The method of manufacturing a semiconductor light-emitting device further includes the step of inspecting the light-emitting element mounted on the lead frame. The step of bonding the heat-radiating member to the back face of the lead frame may be performed after the step of inspecting the light-emitting element.

By doing so, it is possible to attach the heat-radiating member only to the lead frame having a non-defective light-emitting element mounted thereon, which makes it possible to increase yields of the heat-radiating member. Moreover, it is possible to improve efficiency in mounting operation. As a result, the cost of manufacturing the semiconductor light-emitting device is reduced.

In one aspect of the method of manufacturing a semiconductor light-emitting device, solder is used as the electrically-conductive layer. Here, the step of bonding the heat-radiating member to the lead frame is performed by applying the electrically-conductive layer on the back face of the lead frame or a surface of the heat-radiating member, and then urging the electrically-conductive layer into contact with the back face of the lead frame and heating the electrically-conductive layer.

In another aspect of the method of manufacturing a semiconductor light-emitting device, a compound containing gold and tin is used as the electrically-conductive layer. Here, the step of bonding the heat-radiating member to the lead frame is performed by evaporating the electrically-conductive layer onto the back face of the lead frame or the surface of the heat-radiating member, and then urging the electrically-conductive layer into contact with the back face of the lead frame and heating the electrically-conductive layer.

In both of the aspects, the above-described semiconductor light-emitting device having a high heat dissipation property is provided with the simplified steps described above.

According to the present invention, as described above, it is possible to provide a semiconductor light-emitting device excellent in heat dissipation property, and a method of manufacturing the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a top view of a semiconductor light-emitting device according to a fourth embodiment of the present invention.

DESCRIPTION OF THE PREFERRED EMBODIMENTS

Embodiments of a semiconductor light-emitting device and a method of manufacturing the same according to the present invention will now be described in reference to FIGS. 1A to 5.

First Embodiment

Figure 1A:
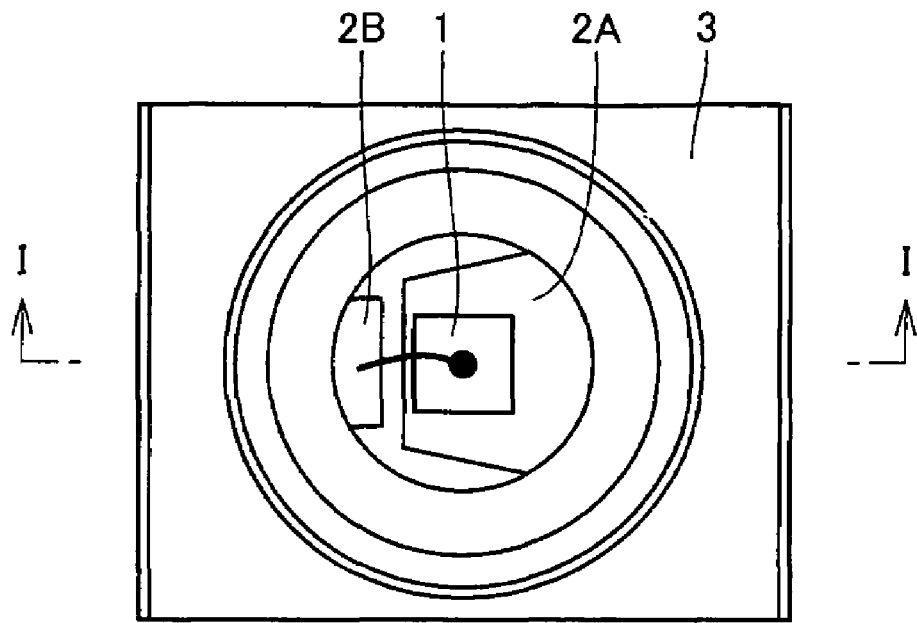
FIG. 1A is a top view of a semiconductor light-emitting device according to a first embodiment of the present invention.
Figure 1B:
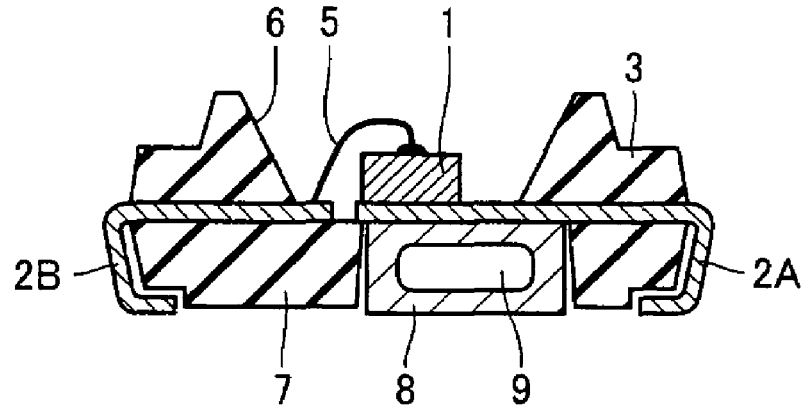
FIG. 1B is a cross-section of the semiconductor light-emitting device according to the first embodiment of the present invention, along a line I—I in FIG. 1A.

FIGS. 1A and 1B show a semiconductor light-emitting device according to an embodiment of the present invention. FIG. 1A is a top view, while FIG. 1B is a cross-section along a line I—I in FIG. 1A.

The semiconductor light-emitting device according to the present embodiment includes a light-emitting element 1, a lead frame 2A (first lead frame) having a main surface having the light-emitting element mounted thereon, a lead frame 2B (second lead frame) spaced apart from lead frame 2A, resin molded portions 3 and 7 (resin portions) for fixing lead frames 2A and 2B, and a heat-radiating member 8 bonded to a back face of lead frame 2A with a brazing member (electrically-conductive layer) containing metal interposed therebetween. In the example in FIGS. 1A and 1B, the brazing member and heat-radiating member 8 are formed immediately below and around light-emitting element 1.

Light-emitting element 1 mounted on lead frame 2A is, for example, a light emitting diode (LED). On main surfaces of lead frames 2A and 2B, resin molded portion 3 (on an upper side) is provided to surround light-emitting element 1. Lead frames 2A and 2B are formed to correspond to a circuit pattern. Light-emitting element 1 and lead frame 2B are connected as appropriate by a wire 5 made of Au or the like. Resin molded portion 3 has a reflecting portion 6. Accordingly, light emitted from light-emitting element 1 is reflected thereon so that an angle at which the light is to be emitted is adjusted. On the back face of lead frame 2A and a back face of lead frame 2B, resin molded portion 7 (on a lower side) is formed. Lead frames 2A and 2B are fixed by resin molded portions 3 and 7.

For lead frames 2A and 2B, it is possible to use a copper alloy in which an Fe—Ni—P based compound is finely dispersed and deposited. By using this, it is possible to obtain a lead frame excellent in strength and heat resistance. When the material above is used, the lead frame has a thermal conductivity of approximately 310 (W/m·K). Although the thermal conductivity of this material is inferior to that of copper, which is approximately 400 (W/m K), and that of silver, which is approximately 420 (W/m·K), it is quite similar to that of gold, which is approximately 310 (W/m·K). The thermal conductivity of this material is extremely superior to that of aluminum nitride (AlN), which is approximately 150–200 (W/m·K), and that of alumina ($Al_2O_3$), which is approximately 20–40 (W/m·K), both of them being ceramics.

The thicknesses of lead frames 2A and 2B can be modified as appropriate, and may be, for example, approximately at least 0.3 mm and at most 0.5 mm. With the thickness of this order, sufficient efficiency in heat transfer in a horizontal direction and a sufficient folding property of the lead frame can be assured.

The main surfaces of lead frames 2A and 2B (the upper side in FIG. 1B) are, for example, Ag-plated. Therefore, light emitted from light-emitting element 1 is efficiently reflected to the front (upwardly in FIG. 1B).

For the brazing member for forming the electrically-conductive layer that bonds lead frame 2A and heat-radiating member 8, it is possible to use solder, a compound containing gold and tin (hereinafter it may be referred to as AuSn), and others. By using these materials, it is possible to significantly improve thermal conductivity between light-emitting element 1 and lead frame 2A, and heat-radiating member 8. Furthermore, it is also possible to use an Ag paste blended with a resin for the brazing member. In this case, heat-radiating member 8 can be bonded to lead frame 2A at a relatively low temperature (e.g. approximately 150° C.).

For heat-radiating member 8, a material containing copper, aluminum, a copper alloy, an aluminum alloy and others, and a ceramic material are used. By using any of these materials, heat-radiating member 8 sufficiently functions as a member for improving efficiency in heat dissipation.

In recent years, a white LED, which is obtained, for example, by applying phosphors to a blue LED to generate quasi-white light or by using red/green/blue LEDs to generate white light, has been provided and increasingly been demanded. The white LED used for backlight of a liquid crystal or lighting requires extremely high luminous intensity. Therefore, an attempt is made to increase the size of the light-emitting element. For example, a current of approximately 20 mA has conventionally flowed through a light-emitting element of approximately 0.3 mm×0.3 mm, whereas a current of 350 mA flows through a light-emitting element of approximately 1 mm×1 mm in recent years. When the currents above are converted into power, the power used in recent years (approximately 1 W) is at least 10 times as high as the power conventionally used (0.07 W). As the power increases, heat generation from the light-emitting element increases. Therefore, it is critical to disperse, transfer, and dissipate thermal energy generated in the light-emitting element in a manner as prompt as possible.

In this regard, in the semiconductor light-emitting device having the above-described structure according to the present embodiment, heat generated in light-emitting element 1 is more likely to be transferred to heat-radiating member 8 via lead frame 2A. As a result, a semiconductor light-emitting device having a high heat dissipation property is provided. Here, by bonding heat-radiating member 8 to lead frame 2A, thermal conductivity can further be improved when compared to the case where heat-radiating member 8 is simply provided under light-emitting element 1. Furthermore, by urging heat-radiating member 8 into contact with lead frame 2A to make them electrically conductive via brazing member (electrically-conductive layer), thermal conductivity can further be improved when compared to the case where heat-radiating member 8 is simply brought into contact with lead frame 2A.

As shown in FIG. 1B, heat-radiating member 8 has a cavity portion 9. By allowing a fluid of high thermal conductivity such as a silicon oil to flow through cavity portion 9, a heat dissipation property can further be improved. In other words, by providing a cavity portion serving as a coolant channel, a heat dissipation property of the semiconductor light-emitting device is improved.

As described above, the present embodiment provides a semiconductor light-emitting device in which thermal conductivity between heat-radiating member 8 and lead frame 2A having light-emitting element 1 mounted thereon is high, and thus a heat dissipation property is high as a whole.

Each of FIGS. 2A–2D is a cross-section of the above-described semiconductor light-emitting device in each of manufacturing steps.

Figure 2A:
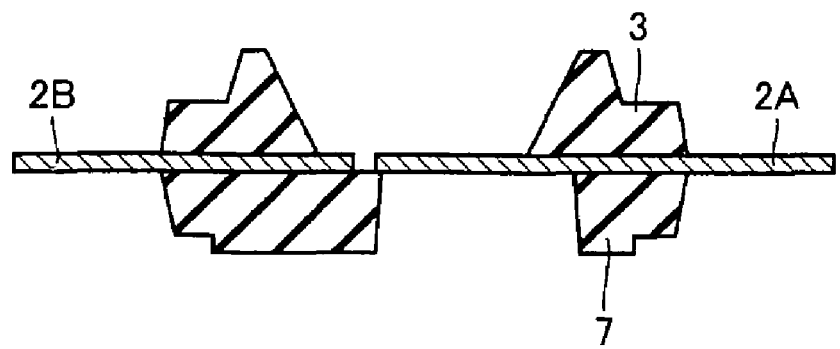
FIG. 2A is a cross-section of the semiconductor light-emitting device shown in FIGS. 1A and 1B in one of manufacturing steps.
Figure 2B:
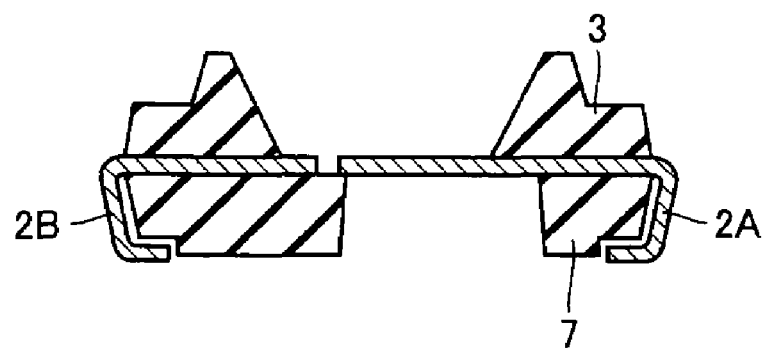
FIG. 2B is a cross-section of the semiconductor light-emitting device shown in FIGS. 1A and 1B in one of the manufacturing steps.
Figure 2C:
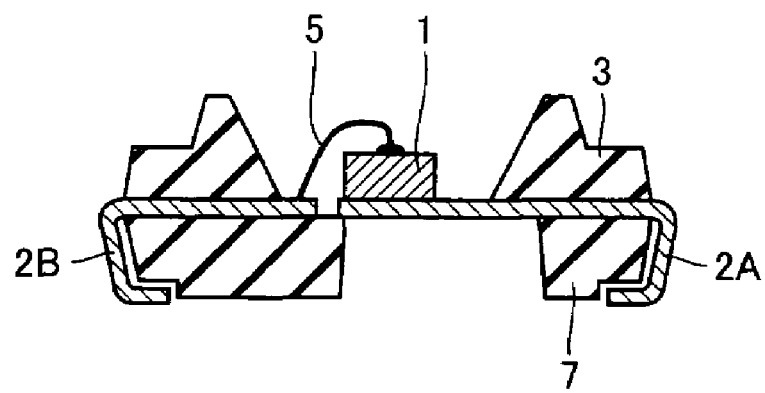
FIG. 2C is a cross-section of the semiconductor light-emitting device shown in FIGS. 1A and 1B in one of the manufacturing steps.
Figure 2D:
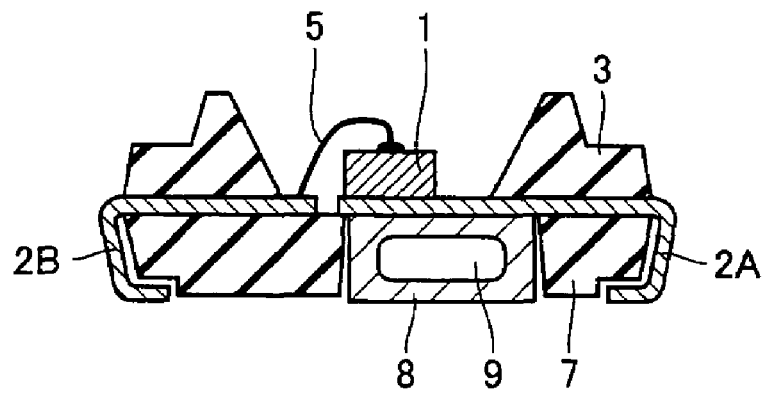
FIG. 2D is a cross-section of the semiconductor light-emitting device shown in FIGS. 1A and 1B in one of the manufacturing steps.

As shown in FIGS. 2A–2D, a method of manufacturing a semiconductor light-emitting device according to the present embodiment includes the steps of forming resin molded portions 3 and 7 (resin portions) for holding lead frames 2A and 2B such that the back face of lead frame 2A is exposed (FIG. 2A), folding lead frames 2A and 2B (FIG. 2B), mounting light-emitting element 1 on a main surface of lead frame 2A located at the exposed back face of lead frame 2A (FIG. 2C), and bonding heat-radiating member 8 to the exposed back face of lead frame 2A by the brazing member (electrically-conductive layer) containing metal interposed therebetween (FIG. 2D).

Figure 6:
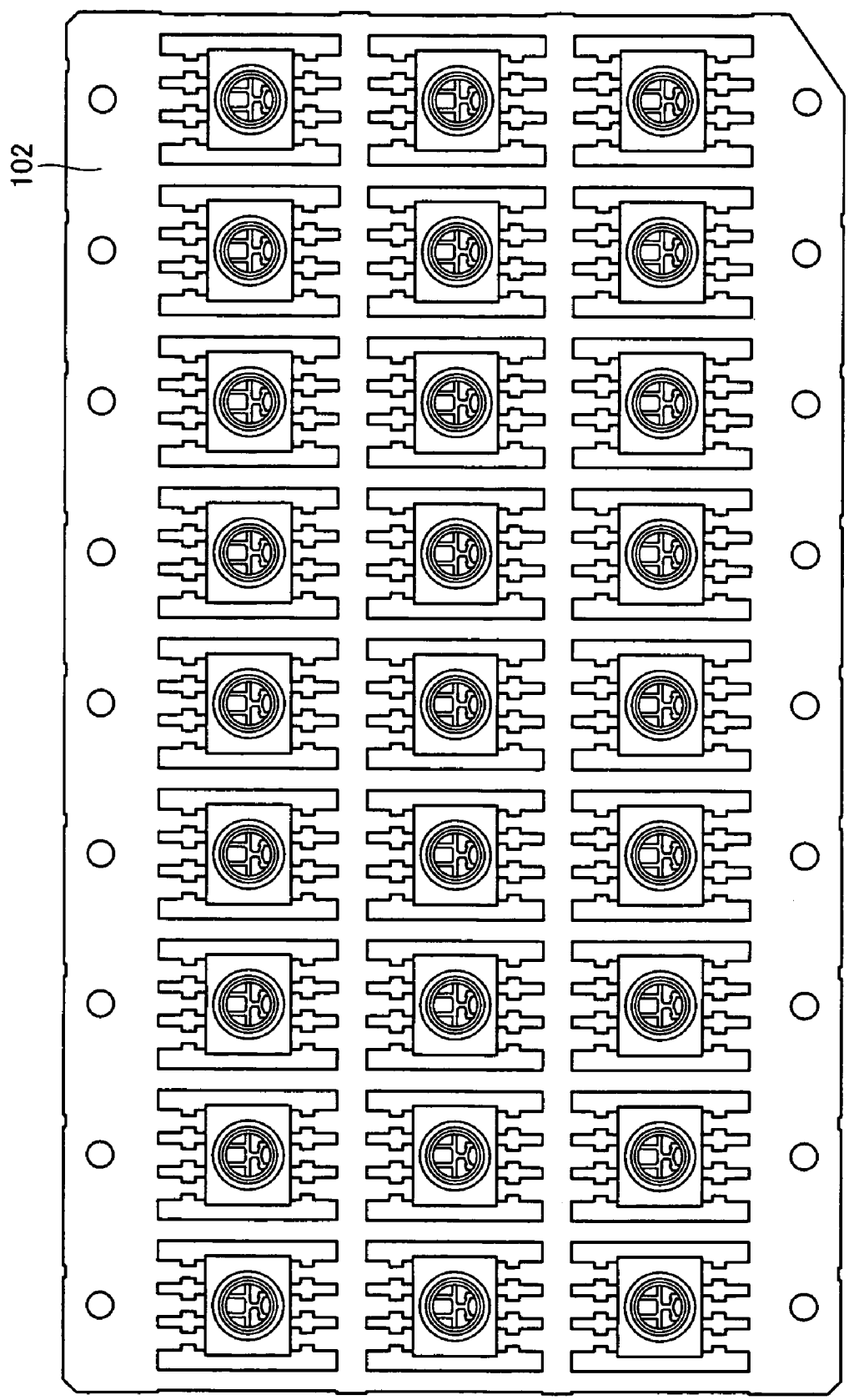
FIG. 6 is a top view showing how a resin molded portion is formed on a lead frame to surround a light-emitting element.
Figure 7A:
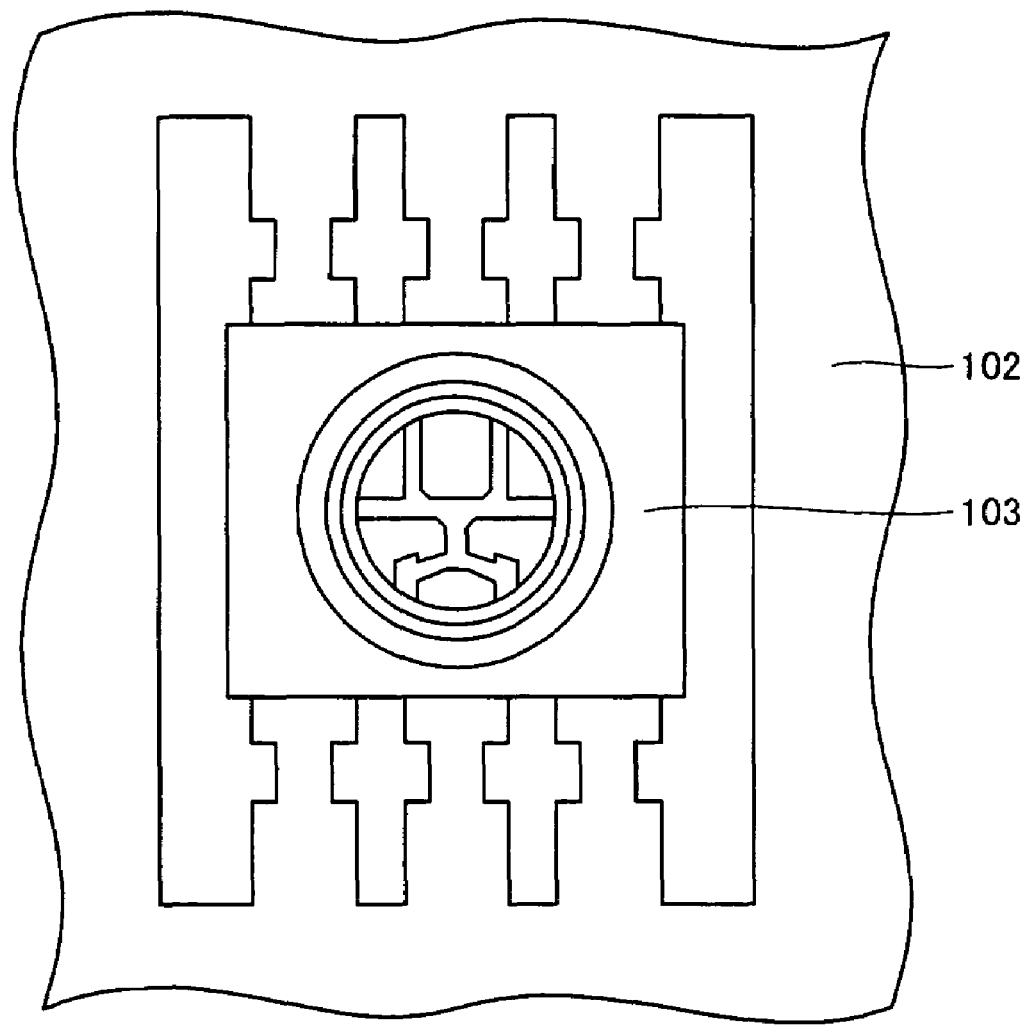
FIG. 7A is a top view of a conventional semiconductor light-emitting device.
Figure 7B:
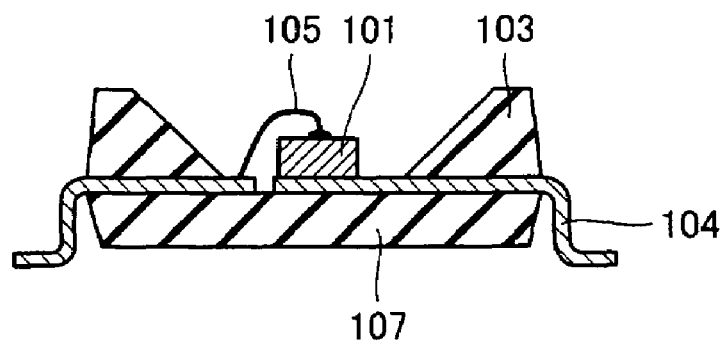
FIG. 7B is a cross-section of the conventional semiconductor light-emitting device.

Referring to FIG. 2A, resin molded portions 3 and 7 for fixing lead frames 2A and 2B are formed by, for example, insert molding. Here, mass production can easily be realized by adopting a technique of forming a plurality of patterns of lead frames 2A and 2B on a single, plate-like member in a continuous manner (e.g. a state as in FIG. 6 described above), forming resin molded portions 3 and 7 on each of the patterns, and then splitting the plate-like member.

Referring to FIG. 2B, lead frames 2A and 2B are folded into a given shape. As such, a lead terminal portion is formed.

Referring to FIG. 2C, light-emitting element 1 is die-bonded to the main surface of lead frame 2A. For the die-bonding material, an Ag paste, solder, AuSn or the like is used. Afterwards, wire 5 is used to connect the light-emitting element to lead frame 2B, and light-emitting element 1 is inspected on its property (in an inspection step).

Referring to FIG. 2D, only in a device whose light-emitting element 1 mounted on lead frame 2A is determined to be non-defective in the inspection step above, heat-radiating member 8 is bonded to the back face of lead frame 2A with the brazing member containing metal interposed therebetween.

As such, it is possible to attach heat-radiating member 8 only to lead frame 2A having non-defective light-emitting element 1 mounted thereon, which can improve yields of heat-radiating member 8, and efficiency in mounting operation as well. As a result, the cost of manufacturing the semiconductor light-emitting device is reduced.

Here, if solder is used as the brazing member (electrically-conductive layer) to bond heat-radiating member 8 to lead frame 2A, the step of bonding heat-radiating member 8 to lead frame 2A is performed by applying the brazing member on the back face of lead frame 2A or a surface of heat-radiating member 8, and then urging the brazing member into contact with the back face of lead frame 2A and heating the brazing member.

If a compound (AuSn) containing gold and tin is used as the brazing member (electrically-conductive layer) to bond heat-radiating member 8 to lead frame 2A, the step of bonding heat-radiating member 8 to lead frame 2A is performed by evaporating the brazing member onto the back face of lead frame 2A or the surface of heat-radiating member 8, and then urging the brazing member into contact with the back face of lead frame 2A and heating the brazing member.

In both cases, the above-described semiconductor light-emitting device having a high heat dissipation property is provided with the simplified steps.

Second Embodiment

Figure 3:
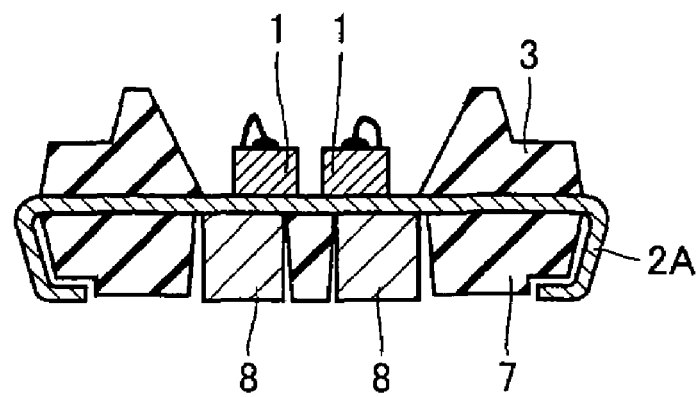
FIG. 3 is a cross-section of a semiconductor light-emitting device according to a second embodiment of the present invention.

FIG. 3 is a cross-section of a semiconductor light-emitting device according to a second embodiment.

The semiconductor light-emitting device according to the present embodiment is a modification of the semiconductor light-emitting device according to the first embodiment, and characterized in that a plurality of light-emitting elements 1 are mounted on lead frame 2A, and that heat-radiating member 8 is provided in a lower portion of each of the plurality of light-emitting elements 1, as shown in FIG. 3.

Even if the plurality of light-emitting elements 1 are mounted on lead frame 2A, as described above, it is possible to use a single heat-radiating member 8 to improve a heat dissipation property. However, as shown in FIG. 3, by dividing heat-radiating member 8 into a plurality of sections to be provided, the entire size of heat-radiating member 8 can be made smaller. Accordingly, it is possible to reduce weight and cost of the semiconductor light-emitting device. Moreover, interference between the plurality of light-emitting elements 1 caused by heat from themselves is suppressed, and the plurality of light-emitting elements 1 are electrically insulated from each other, which provides higher flexibility in electrical wiring.

In the present embodiment, as described above, it is possible to improve efficiency in heat dissipation of the semiconductor light-emitting device in which the plurality of light-emitting elements 1 are mounted on lead frame 2A.

In the present embodiment, the detailed description of the features similar to those in the first embodiment described above will not be repeated.

Third Embodiment

Figure 4A:
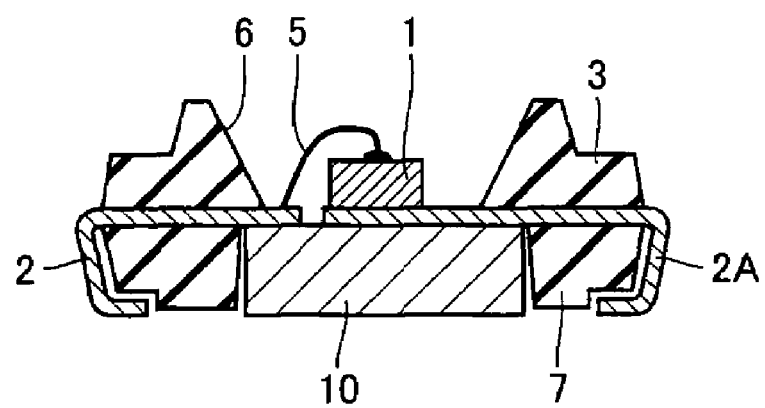
FIG. 4A is a cross-section of a semiconductor light-emitting device according to a third embodiment of the present invention.
Figure 4B:
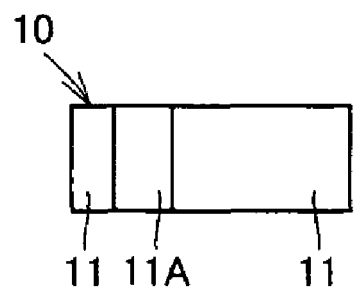
FIG. 4B is a top view of a heat-radiating member of the semiconductor light-emitting device shown in FIG. 4A.

FIGS. 4A and 4B show a semiconductor light-emitting device according to a third embodiment. FIG. 4A is a cross-section of the semiconductor light-emitting device, while FIG. 4B is a top view of a heat-radiating member 10 in the semiconductor light-emitting device shown in FIG. 4A.

The semiconductor light-emitting device according to the present embodiment is a modification of the semiconductor light-emitting devices according to the first and second embodiments, and characterized in that heat-radiating member 10 made of a ceramic material is bonded to the back faces of lead frame 2A (first lead frame) and lead frame 2B (second lead frame) with a metallized layer 11 (electrically-conductive layer) interposed therebetween, and that metallized layer 11 is split (an exposed portion 11A of the ceramic material is formed) in order to make lead frames 2A and 2B electrically non-conductive via metallized layer 11 in a gap between lead frames 2A and 2B, as shown in FIGS. 4A and 4B.

In the above-described semiconductor light-emitting device, a light-emitting element not shown, for example, may also be mounted on lead frame 2B. In this case, by adopting the structure above, it is possible to efficiently release heat generated from the light-emitting elements on lead frames 2A and 2B to the outside, while preventing electrical short between lead frames 2A and 2B.

In the present embodiment, as described above, it is possible to improve efficiency in heat dissipation of the semiconductor light-emitting device in which a light-emitting element is mounted on each of the plurality of lead frames (lead frames 2A and 2B) with a simple technique.

In the present embodiment, the detailed description of the features similar to those in the first and second embodiments described above will not be repeated.

Fourth Embodiment

FIG. 5 is a top view showing a semiconductor light-emitting device according to a fourth embodiment.

The semiconductor light-emitting device according to the present embodiment is a modification of the semiconductor light-emitting devices according to the first to third embodiments, and characterized in that a heat-radiating member 12 is provided to couple a plurality of lead frames each having a light-emitting element 1 mounted thereon as shown in FIG. 5.

Accordingly, heat-radiating member 12 can be used as a member for coupling the plurality of lead frames. As a result, a semiconductor light-emitting device having light-emitting elements 1 arranged at high density is provided.

In heat-radiating member 12, a cavity portion 14 is provided to serve as a coolant channel. A circulating pump 13 allows a coolant for improving a heat dissipation property to circulate through the coolant channel.

In the present embodiment, as described above, it is possible to obtain a semiconductor light-emitting device having light-emitting elements arranged thereon at high density and having a high heat dissipation property.

In the present embodiment, the detailed description of the features similar to those in the first to third embodiments described above will not be repeated.

The embodiments of the present invention have been described and illustrated. It is intended from the beginning to combine the characteristic portions as appropriate in each of the embodiments described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light-emitting device, comprising:
   a light-emitting element;
   a first lead frame having a main surface having said light-emitting element mounted thereon;
   a resin portion for fixing said first lead frame, said resin portion has a reflecting portion reflecting light emitted from said light-emitting element; and
   a heat-radiating member bonded to a back face of said first lead frame with an electrically-conductive layer containing metal interposed therebetween, said electrically-conductive layer is formed to extend from an area below the reflecting portion to the area outside the area covered by the reflecting portion.

2. The semiconductor light-emitting device according to claim 1, wherein said electrically-conductive layer and said heat-radiating member are formed immediately below and around said light-emitting element.

3. The semiconductor light-emitting device according to claim 1, wherein said heat-radiating member has a cavity portion serving as a coolant channel.

4. The semiconductor light-emitting device according to claim 1, wherein said heat-radiating member is provided to couple a plurality of said first lead frames each having light-emitting element mounted thereon.

5. The semiconductor light-emitting device according to claim 1, wherein said heat-radiating member contains at least one material selected from the group consisting of copper, aluminum, a copper alloy, and an aluminum alloy.

6. The semiconductor light-emitting device according to claim 1, wherein said heat-radiating member is formed of a ceramic material.

7. The semiconductor light-emitting device according to claim 6, further comprising a second lead frame spaced apart from said first lead frame and electrically connected to said light-emitting element via a wire, wherein
   said heat-radiating member is bonded to the back face of said first lead frame and a back face of said second lead frame with said electrically-conductive layer interposed therebetween, and
   said electrically-conductive layer is split in order to make said first lead frame and said second lead frame electrically non-conductive via said electrically-conductive layer in a gap between said first and second lead frames.

8. The semiconductor light-emitting device according to claim 1, wherein
   said first lead frame has a plurality of said light-emitting elements mounted thereon, and
   said heat-radiating member is provided in a lower portion of each of the plurality of said light-emitting elements.

9. A semiconductor light-emitting device, comprising:
   a plurality of light-emitting elements;
   a plurality of first lead frames each having a main surface and a respective light-emitting element mounted thereon;
   resin portions for fixing each of said first lead frames;
   a heat-radiating member bonded to a back face of each of said first lead frames with an electrically-conductive layer containing metal interposed therebetween, wherein said heat-radiating member is provided to couple said plurality of first lead frames;
   a cavity within said heat-radiating member serving as a coolant channel; and
   a circulating pump for circulating coolant through said coolant channel.

10. A semiconductor light-emitting device, comprising:
    a plurality of light-emitting elements;
    a first lead frame having a main surface, and an entire surface of each said plurality of light-emitting elements are mounted on said main surface of said first lead frame;
    a resin portion for fixing said first lead frame; and
    a plurality of heat-radiating members bonded to a back face of said first lead frame with an electrically-conductive layer containing metal interposed therebetween, wherein
    said plurality of heat-radiating members are provided in a lower portion of each of the plurality of said light-emitting elements.

* * * * *